United States Patent
Nagata

(10) Patent No.: US 9,680,499 B2
(45) Date of Patent: Jun. 13, 2017

(54) DATA COMPRESSION DEVICE AND METHOD

(71) Applicant: FUJITSU LIMITED, Kawasaki-shi, Kanagawa (JP)

(72) Inventor: Jun-ichi Nagata, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/160,105

(22) Filed: May 20, 2016

(65) Prior Publication Data

US 2017/0026054 A1    Jan. 26, 2017

(30) Foreign Application Priority Data

Jul. 24, 2015 (JP) .................. 2015-146265

(51) Int. Cl.
*H03M 7/30* (2006.01)

(52) U.S. Cl.
CPC ........... *H03M 7/30* (2013.01); *H03M 7/3088* (2013.01); *H03M 7/3095* (2013.01); *H03M 7/55* (2013.01)

(58) Field of Classification Search
CPC ........ H03M 7/30; H03M 7/3095; H03M 7/55; H03M 7/3088
USPC .................................................. 341/87, 106
See application file for complete search history.

(56) References Cited

U.S. PATENT DOCUMENTS

| | | | | |
|---|---|---|---|---|
| 7,646,923 B2 * | 1/2010 | Yasue | ............... | H04N 19/12 382/232 |
| 8,866,645 B2 * | 10/2014 | Scott | ................... | H04N 19/17 341/107 |
| 8,983,793 B2 * | 3/2015 | Luo | ..................... | G06F 15/16 702/146 |
| 9,112,779 B2 * | 8/2015 | Yamada | ............ | H04L 43/0817 |
| 9,338,373 B2 * | 5/2016 | Campbell | ........... | H04N 19/423 |

FOREIGN PATENT DOCUMENTS

| | | |
|---|---|---|
| JP | 2006-259937 | 9/2006 |
| JP | 2012-134858 | 7/2012 |

* cited by examiner

*Primary Examiner* — Brian Young
(74) *Attorney, Agent, or Firm* — Fujitsu Patent Center

(57) ABSTRACT

A data compression device including a processor to perform a procedure comprising: obtaining data of a predetermined number (Z) of digits in a time series; and performing a compression process on the data. The data is obtained by encoding a vibration state of a measurement target. The compression process includes: deleting upper digits when the upper digits do not include significant information; and adding a unique code to a top of the upper digits when the upper digits include significant information. A digit number (X) of the upper digits is smaller than the predetermined number (Z).

13 Claims, 8 Drawing Sheets

DATA COMPRESSION DEVICE AND METHOD

CROSS-REFERENCE TO RELATED APPLICATION

This application is based upon and claims the benefit of priority of the prior Japanese Patent Application No. 2015-146265, filed on Jul. 24, 2015, the entire contents of which are incorporated herein by reference.

FIELD

The present invention relates to a device, a method and a program recording medium which relate to compression of data obtained by encoding a measurement target vibration state.

BACKGROUND

In recent years, various data-compressing methods have been proposed for receiving and transmitting between sensor nodes in a sensor network in which each communication terminal including a built-in vibration sensor acts as anode. For example, a compression method which uses Huffman codes allocates a short code to an information source alphabet (a symbol representing information) of a high probability (frequency) of appearance to encode, and can realize reversible compression which minimizes an average length. Further, compression methods such as pulse code modulation (PCM) and adaptive differential pulse code modulation (ADPCM) can enhance data compressibility even though compression is irreversible.

A technique of enhancing compressibility by combining a plurality of compression methods has also been studied. For example, not only compression methods which use Huffman codes but also compression methods which use alpha codes and gamma codes are prepared to select one of a plurality of compression methods and compress data, and add to compressed data a parameter indicating a type of the selected compression method. Thus, by combining a plurality of compression methods, it is possible to further enhance data compressibility (see JP 2012-134858 A and JP 2006-259937 A).

In recent network environment, Internet of things (IoT) and machine to machine (M2M) are advancing, and the amount of information transmitted from each sensor node tends to increase, and therefore a rise in a power consumption amount (electric consumption) of each sensor node is also expected. However, each sensor node is not necessarily disposed at a place at which an electric power infrastructure is built, and needs to be operated for a long period of time by using power of a built-in battery or button battery. Therefore, simply adopting a compression method of a high compressibility increases an arithmetic operation time for a compression process, and causes an increase in power consumption. Further, the same also applies to a technique of searching for an appropriate method from a plurality of compression methods, and, as a load of an arithmetic operation process for a search increases, a disadvantage in terms of electric power becomes greater. Meanwhile, adopting an irreversible compression method to reduce power consumption makes deterioration of information inevitable in return for adoption for this method.

SUMMARY

A data compression device including a processor to perform a procedure comprising: obtaining data of a predetermined number ($Z$) of digits in a time series; and performing a compression process on the data. The data is obtained by encoding a vibration state of a measurement target. The compression process includes: deleting upper digits when the upper digits do not include significant information; and adding a unique code to a top of the upper digits when the upper digits include significant information. A digit number ($X$) of the upper digits is smaller than the predetermined number ($Z$).

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A data compression device, a data compression method and a data compression program according to an embodiment will be described with reference to the drawings. The following embodiment is an exemplary embodiment and does not intend to exclude various modifications and application of a technique which are not described in the embodiment. That is, the present embodiment can be carried out by being variously modified (combining the embodiment and a modified example) without departing from the spirit of the present embodiment.

1. Outline

The data compression device, the data compression method and the data compression program according to the present embodiment perform a reversible compression process on vibration data corresponding to a measurement target vibration state and output the data. These are used to compress a data size while storing information obtained by measuring a vibration, for example. Compression process target vibration data is, for example, data corresponding to a displacement, a speed, and an acceleration of a vibration, or data corresponding to an angular velocity and a sound pressure (sound). Further, compression process target vibration data includes not only raw data which is detected by a vibration sensor (e.g. data obtained by directly encoding a parameter corresponding to a vibration state) but also processed data obtained by preprocessing raw data.

Encoded vibration data includes significant information (meaningful information) and insignificant information (meaningless information). So, removing the insignificant information enables to reduce the amount of vibration data irreversibly. However, as arithmetic operation process of identifying significant information and insignificant information becomes more complex, an arithmetic operation process time becomes longer, and a power consumption amount increases. Meanwhile, insufficient precision to identify significant information and insignificant information makes it impossible to secure reversibility of vibration data. Hence, in the present embodiment, the data compression device, the data compression method and the data compression program which can secure reversibility of a data compression process while employing a simple configuration are proposed.

Figure 1:
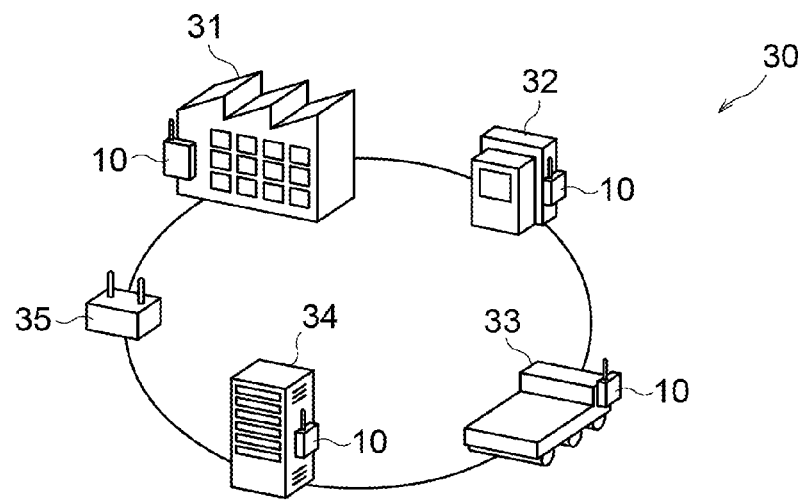
FIG. 1 is a schematic view of a sensor network to which a data compression device is applied.

Data compression devices 10 according to the present embodiment are applied to an ad-hoc sensor network 30 illustrated in FIG. 1. Each data compression device 10 is a communication terminal including a built-in vibration sensor, and functions as a node in a network which is autonomously formed. Each data compression device 10 detects and calculates vibration data obtained by encoding a measurement target vibration state at a position at which each data compression device 10 is installed, and outputs, as a radio signal, compression data obtained by reversibly compressing this vibration data.

FIG. 1 illustrates the sensor network 30 in which the data compression devices 10 are attached to a building 31 (factory), a machine tool 32 in a factory, a transport vehicle 33 and an electronic device 34. This sensor network 30 is connected to wired or wireless networks including the Internet, a wireless communication network for mobile telephones and other digital wireless communication networks via a relay device 35 which functions as a management terminal (gateway terminal). Compression data obtained in the sensor network 30 is transmitted to a management system (not illustrated) provided on these various networks, and is used to analyze vibration noise of the building 31 or analyze working states of the machine tool 32, the transport vehicle 33 and the electronic device 34.

2. Hardware

Figure 2:
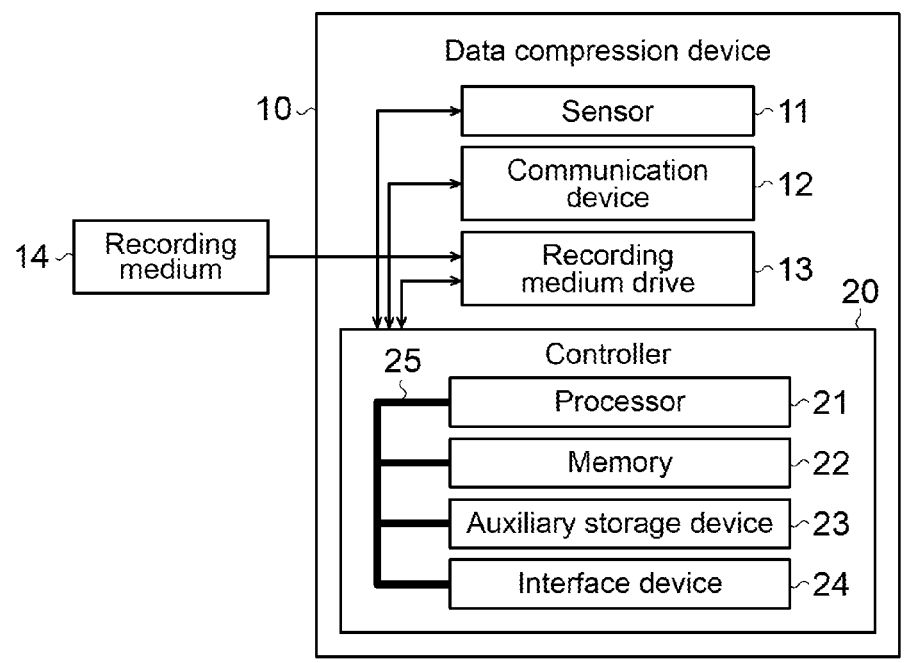
FIG. 2 is a view illustrating a hardware configuration of the data compression device.

FIG. 2 illustrates a hardware configuration of each data compression device 10. Each data compression device 10 includes a built-in sensor 11, communication device 12, recording medium drive 13 and controller 20, and actuates in response to power supply from a power source (e.g. a battery or a button battery) which is not illustrated. The sensor 11 detects and calculates vibration data corresponding to a measurement target vibration state, and is, for example, a displacement sensor, a speed sensor, an acceleration sensor, a gyro sensor and a microphone. The sensor 11 has a function of encoding information such as a displacement, a speed, an acceleration, an angular velocity and a sound pressure corresponding to a vibration state, and outputting the information as data of a predetermined number of digits at a predetermined cycle. A sensing cycle of the sensor 11 is preferably set to a cycle which is at least half or less than half of a cycle at which a measurement target vibrates.

The communication device 12 performs wireless communication between the other data compression devices 10 and the relay device 35 based on predetermined communication technique standards. The communication device 12 has a function (transmitting function) of transmitting at least information transmitted from the controller 20. Further, preferably, the communication device 12 has in combination a function (receiving function) of transmitting to the controller 20 information transmitted from the other data compression devices 10 and the relay device 35. In addition, a communication function between the data compression devices 10 can be realized by using wired communication, too, instead of wireless communication. In this case, the communication device 12 performs wired communication between the other data compression devices 10 and the relay device 35 based on predetermined communication technique standards.

The recording medium drive 13 is a reader/writer device which reads information recorded or stored in a recording medium 14 (removable medium) such as an optical disk or a semiconductor memory, or writes arbitrary information in the recording medium 14. The recording medium drive 13 according to the present embodiment includes both of a function of reading a program recorded or stored in the recording medium 14, transmitting contents of this program to the controller 20, and a function of recording or storing in the recording medium 14 information outputted from the controller 20.

The controller 20 is a controller including a built-in processor 21 (central processing unit), memory 22 (a main memory or a main storage device), auxiliary storage device 23 and interface device 24. Each of these devices 21 to 24 is connected to communicate with each other via an internal bus 25. The processor 21 is the central processing unit including a built-in control unit (control circuit), arithmetic operation unit (arithmetic circuit) and cache memory (register group). Further, the memory 22 is a storage device which stores programs and working data, and includes, for example, a read only memory (ROM) and a random access memory (RAM).

The auxiliary storage device 23 is a memory device which stores data and firmware to be held for a long period of time compared to those in the memory 22, and includes a non-volatile memory such as a flash memory or an electrically erasable programmable read-only memory (such as EEPROM). Further, the interface device 24 controls an input and an output (I/O) inside and outside the controller 20. The controller 20 is connected to the sensor 11, the communication device 12 and the recording medium drive 13, respectively, via the interface device 24.

3. Software

Figure 3:
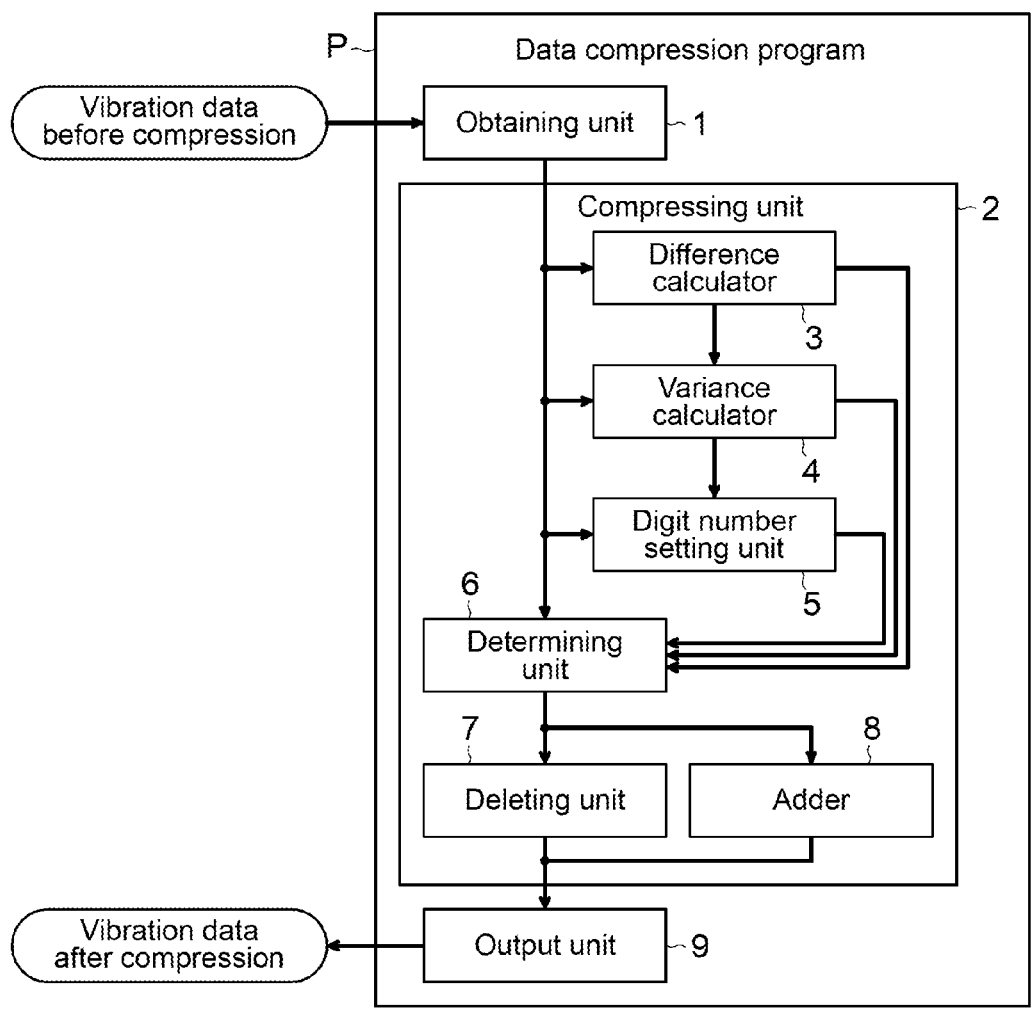
FIG. 3 is a block diagram illustrating a function of a data compression program.

FIG. 3 is a block diagram for explaining process contents of a data compression program P executed by the processor 21 of the controller 20. These process contents are recorded as an application program in the auxiliary storage device 23 and the recording medium 14, and is expanded on the memory 22 and executed. The process contents executed herein are functionally classified as an obtaining unit 1, a compressing unit 2 and an output unit 9 for the data compression program P. Further, a function of the compressing unit 2 is subdivided as a difference calculator 3, a variance calculator 4, a digit number setting unit 5, a determining unit 6, a deleting unit 7 and an adder 8 inside the compressing unit 2.

The obtaining unit 1 obtains, in a time series, data of a predetermined number of digits obtained by encoding a measurement target vibration state. Individual items of vibration data transmitted from the sensor 11 are aligned in the time series, and are recorded in a compression data memory (data storage area) on the memory 22. Here, a portion corresponding to X digits (X≥1) from the most significant bit (MSB) in vibration data (each vibration data) corresponding to a vibration state detected by the sensor 11 at a given time will be referred to as "upper digits". Further, a portion corresponding to Y digits from the least significant bit (LSB) will be referred to as "lower digits". The "upper digits" may be a singular digit or plural digits. The "lower digits" may be a singular digit or plural digits in the same way.

Figure 4:
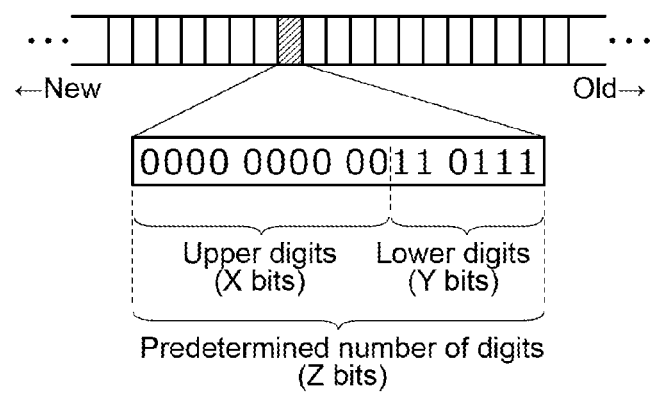
FIG. 4 is a view for explaining a structure of vibration data obtained by the data compression device.

When a total number of digits (a predetermined number of digits) of one vibration data is Z digits, a sum of the number of upper digits X (the first number of digits and the number of upper digits) and the number of lower digits Y (the second number of digits and the number of lower digits) is Z (X+Y=Z). That is, the lower digits include the number of digits Y obtained by subtracting the number of upper digits X from the total number of digits Z. In addition, a value of the number of upper digits X takes an integer having a value equal to or more than 0 and less than the total number of digits Z of vibration data (0≤X<Z). In other words, a digit number (X) of the upper digits is smaller than the predetermined number (Z). A value of the number of lower digits Y is a natural number equal to or less than the total number of digits Z (0<Y≤Z). In this regard, FIG. 4 illustrates an alignment state of vibration data recorded on the compression data memory. In this illustration, one vibration data is encoded as binary digits of 16 bits (2 bytes), and the total number of digits Z of vibration data is 16.

The compressing unit 2 performs a compression process on the vibration data obtained by the obtaining unit 1. In this case, whether or not upper digits of the preset number of digits X include significant information is determined, and vibration data is processed according to this determination result. This determination is performed by the determining unit 6. The number of digits X used for this determination is set by the digit number setting unit 5 based on, for example, a variance value σ calculated by the variance calculator 4. Further, a compression target is, for example, vibration data obtained by the obtaining unit 1 or difference data of the vibration data (e.g. temporal subtraction data). The difference data is calculated by the difference calculator 3.

As a result of the above determination, when the upper digits do not include significant information, the deleting unit 7 deletes the upper digits. Meanwhile, when the upper digits include significant information, the upper digits are left as they are, and an exceptional process code is added to the top of the upper digit by the adder 8. The exceptional process code is a unique code. In addition, characteristics of the sensor 11 are that the upper digits have a small possibility for including significant information compared to the lower digits. Consequently, it is possible to reduce a data amount by deleting the upper digits which do not include the significant information. However, blindly mixing vibration data whose upper digits are deleted and vibration data whose upper digits are not deleted makes it difficult to identify these items of vibration data, and may undermine reversibility. Hence, by adding an exceptional process code only to the vibration data whose upper digits are not deleted, these items of vibration data are identified. The function of the compressing unit 2 will be described below in detail.

Figure 5A:
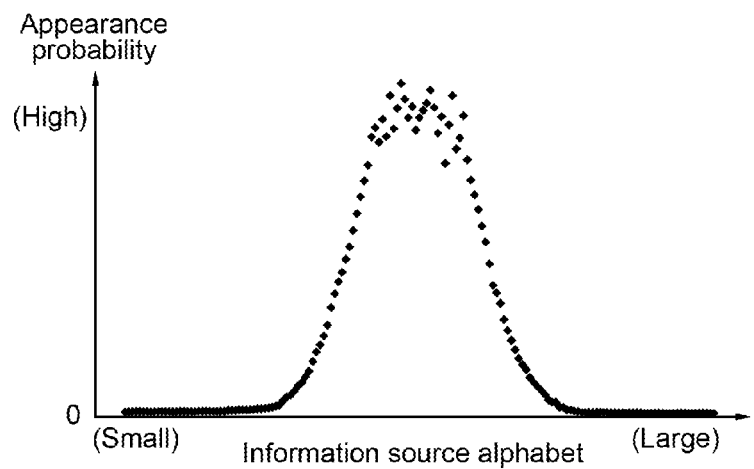
FIG. 5A is a graph illustrating a relationship between a value of vibration data (information source alphabet) and an appearance probability.
Figure 5B:
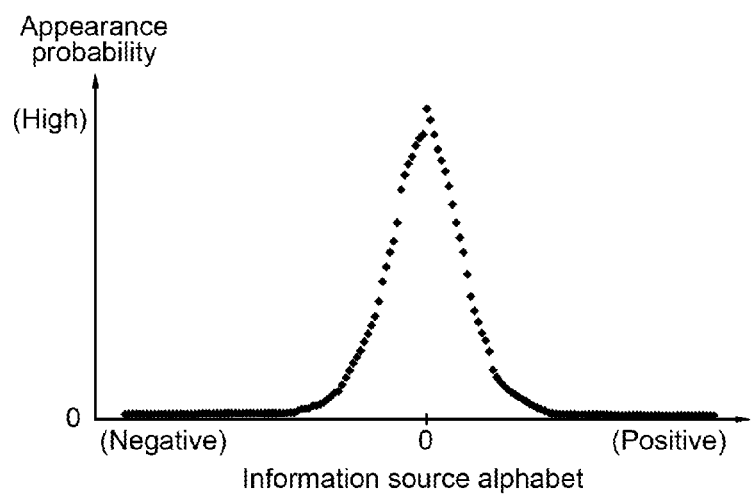
FIG. 5B is a graph illustrating a relationship between a difference value of vibration data and an appearance probability.
Figure 5C:
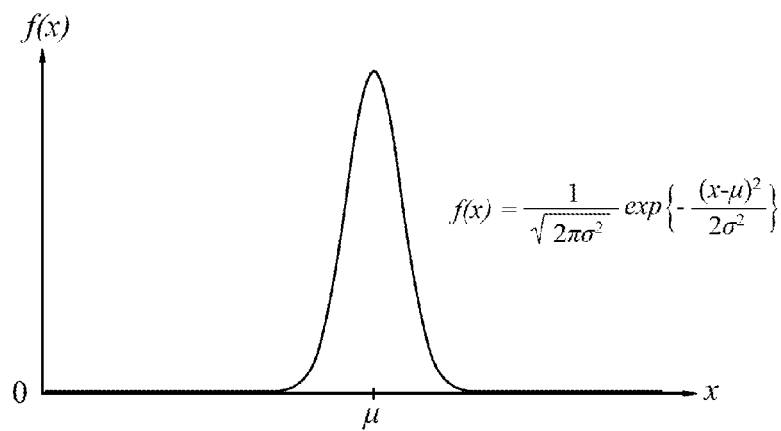
FIG. 5C is a graph of a probability density function of providing a normal distribution according to a comparative example.

The difference calculator 3 calculates a difference value of items of vibration data adjacent in the time series. In this regard, FIG. 5A illustrates a relationship between an information source alphabet of vibration data (a value of vibration data) and an appearance probability of the information source alphabet. A distribution of items of vibration data is a dispersed distribution in a relatively wide range around an average value. By contrast with this, a distribution of difference values of items of vibration data is a distribution similar to a normal distribution as illustrated in FIG. 5B. In addition, what can be read is that FIG. 5C illustrates a comparative example illustrating a graph of a probability density function which provides a normal distribution, and illustrates a shape similar to a distribution shape in FIG. 5B. Thus, data randomness increases by calculating a difference value of items of vibration data, and precision to estimate a variance by using a normal distribution model improves.

The variance calculator 4 estimates and calculates the variance value σ of vibration data or the variance value σ of a difference value of items of vibration data. In this regard, for example, an appearance probability of an information source alphabet is regarded as a normal distribution to calculate the variance value σ. It is preferable to use a difference value of items of vibration data instead of using vibration data to improve precision to calculate the variance value σ. The calculated variance value is referred to in order to determine the number of upper digits X and the number of lower digits Y. Vibration data and a difference value of the items of vibration data will be collectively referred to as "input data" below.

Two methods will be exemplified as methods for calculating the variance value σ. A first method is a method of calculating an arithmetic mean calculated by squaring a difference between the variance value σ and an average value of items of input data. The variance value σ is calculated according to, for example, following equation 1. n in equation 1 represents the number of items of input data, $x_i$ represents ith input data and μ represents an average value of items of input data.

[Formula 1]

$$\sigma = \sqrt{\frac{1}{n}\sum_{i=1}^{n}(x_i - \mu)^2} \quad \text{(Equation 1)}$$

Figure 6A:
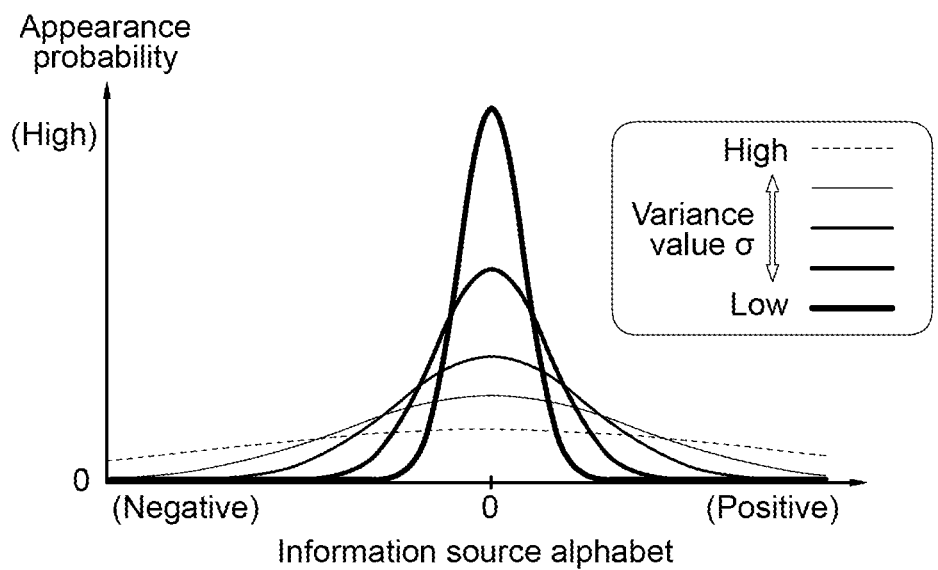
FIG. 6A is a graph for explaining a shape change which occurs when a variance value σ changes in the graph of the probability density function of providing the normal distribution.
Figure 6B:
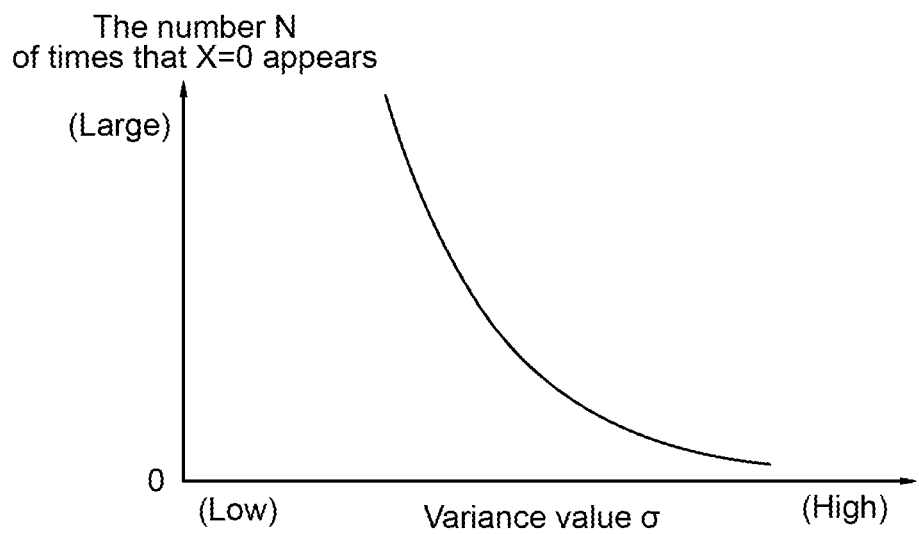
FIG. 6B is a graph illustrating a relationship between the variance value and the number of times of appearances of $x=0$.

A second method is a method for estimating the variance value σ by counting the number of times N that a value of input data takes 0. As illustrated in FIG. 6A, characteristics of a value in case of $X=\mu=0$ in the probability density function (corresponding to a maximum value) are that the value increases as the variance value σ decreases. Consequently, by counting the number of times of appearances of x=0 (the number of times N that the value of the input data takes 0), it is possible to estimate the variance value σ. In this case, as illustrated in FIG. 6B, a relationship between the number of times N that x=0 appears and the variance value may be stored as a map, a graph or a table. Information of the estimated variance value σ is transmitted to the digit number setting unit 5.

The digit number setting unit 5 sets the number of upper digits X and the number of lower digits Y. In this regard, at least one of the numbers of digits X and Y is set. Values of these numbers of digits X and Y may be preset fixed values or may be variable values set according to contents of vibration data. In the latter case, the numbers of digits X and Y may be set based on the variance value calculated by the variance calculator 4. In addition, when the number of upper digits X is set, the number of lower digits Y takes a value equal to Z-X. Similarly, when the number of lower digits Y is set, the number of upper digits X is Z-Y digits. Hence, the digit number setting unit 5 has a function of setting at least one of the number of upper digits and the number of lower digits.

Figure 7A:
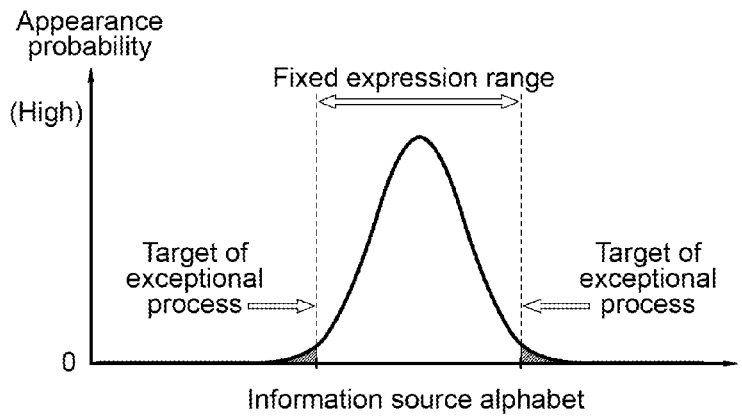
FIG. 7A is a graph for explaining a relationship between a fixed expression range corresponding to the number of lower digits Y, and an exceptional process probability.

When it is assumed that an input data distribution complies with a normal distribution, as the number of lower digits Y to be stored without being deleted becomes greater, the number of information source alphabets covered by the number of lower digits Y becomes larger, and therefore an exceptional process probability (a probability that upper digits include significant information) lowers. For example, as the number of lower digits Y increases, the number of information source alphabets which can be expressed as lower digits increases, and a fixed expression range illustrated in FIG. 7A is expanded. In response to this expansion, a portion (exceptional process target) corresponding to a range which is outside the fixed expression range decreases. Meanwhile, when the number of lower digits Y increases, the number of upper digits X decreases, and therefore data compression efficiency slightly lowers. Hence, it is preferable to set the number of upper digits X and the number of lower digits Y by taking into account the data compression efficiency.

A specific method for setting the numbers of digits X and Y based on the variance value includes storing a relationship between the variance value and the number of digits Y as a map, a graph or a table in advance. For example, the number of digits Y corresponding to the variance value may be set based on a graph illustrated in FIG. 7B. In this graph, a change of an average code length which occurs when lower digits are set to 6 digits to 9 digits, respectively, is superimposed and displayed. A horizontal axis of a graph indicates the variance value σ(logarithmic numeral) and a vertical axis indicates an average code length. The average code length changes to be asymptotically close to the number of lower digits Y as the variance value is small (a variance range is wide). Meanwhile, a range of the variance value σ in which the average code length substantially matches with the number of digits Y is expanded as the number of lower digits Y increases.

In this regard, the variance value σ corresponding to a point at which a graph in case where the number of digits Y is 6 digits and a graph in case where the number of digits Y is 7 digits intersects is $\sigma_1$. Similarly, the variance value σ corresponding to an intersection point of a graph in case of 7 digits and a graph in case of 8 digits is $\sigma_2$, and the variance value σ corresponding to an intersection point of a graph in case of 8 digits and a graph in case of 9 digits is $\sigma_3$. To minimize the average code length, it is preferable to set the number of lower digits Y to 6 digits (the number of upper digits X to 10 digits) when the variance value σ is less than $\sigma_1$. Further, it is preferable to set the number of lower digits Y to 7 digits (the number of upper digits X to 9 digits) when the variance value σ is in range from $\sigma_1$ to $\sigma_2$, set the number of lower digits Y to 8 digits (the number of upper digits X to 8 digits) when the variance value σ is in a range from $\sigma_2$ to $\sigma_3$, and set the number of lower digits Y to 9 digits (the number of upper digits X to 7 digits) when the variance value σ is $\sigma_3$ or more. Thus, by selecting the number of lower digits Y which minimizes the average code length according to the variance value σ, data compression efficiency improves.

Figure 7B:
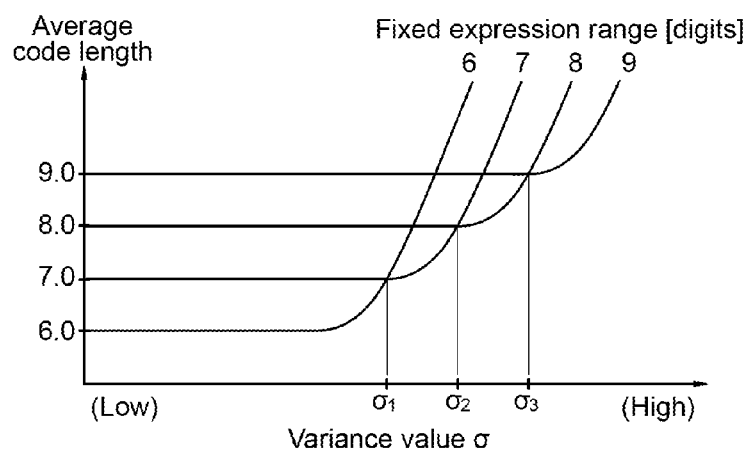
FIG. 7B is a graph for explaining a relationship between the variance value σ and an average code length.
Figure 7C:
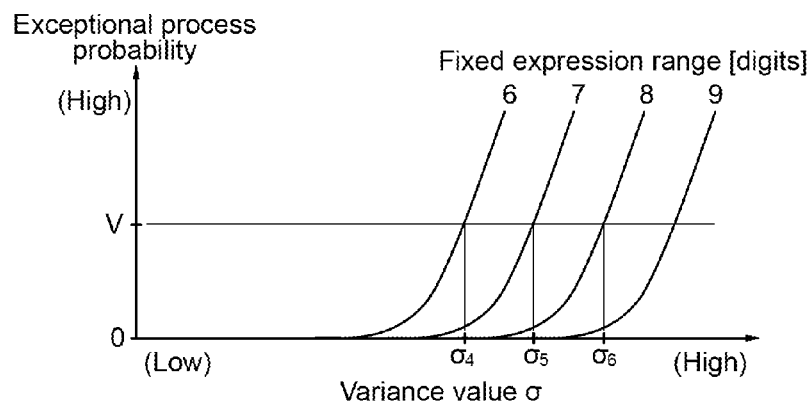
FIG. 7C is a graph for explaining a relationship between the variance value σ and an exceptional process probability.

Further, the number of digits Y corresponding to the variance value σ may be set based on a graph illustrated in FIG. 7C. In this graph, a change of an exceptional process probability (a probability that upper digits are deleted) which occurs when lower digits are set to 6 digits to 9 digits, respectively, is superimposed and displayed. A horizontal axis of the graph indicates the variance value σ (logarithmic numeral), and the vertical axis indicates an exceptional process probability. The exceptional process probability increases when the variance value σ is higher, yet hardly increases when the number of lower digits Y which is a fixed expression range is larger, so that it is possible to support input data of the higher variance value σ, too.

In this regard, in regard to a variance which provides a predetermined probability V as the exceptional process probability, the variance values σ in case where the number of lower digits are 6 digits to 8 digits, respectively, are $\sigma_4$, $\sigma_5$ and $\sigma_6$. To keep the exceptional process probability at the predetermined probability or less, it is preferable to set the number of lower digits Y to 6 digits (the number of upper digits X to 10 digits) when the variance value σ is less than $\sigma_4$. Further, it is preferable to set the number of lower digits Y to 7 digits (the number of upper digits X to 9 digits) when the variance value σ is in a range from $\sigma_4$ to $\sigma_5$, set the number of lower digits Y to 8 digits (the number of upper digits X to 8 digits) when the variance value σ is in the range from $\sigma_5$ to $\sigma_6$, and set the number of lower digits Y to 9 digits (the number of upper digits X to 7 digits) when the variance value σ is $\sigma_6$ or more. Information of the numbers of digits X and Y set in this way is transmitted to the determining unit 6.

The determining unit 6 determines for individual vibration data whether or not the upper digits of the number of digits X include significant information. The phrase "include significant information" described herein means that upper digits have different values (i.e. the upper digits have values which change) compared to a case where data is encoded in a state where a measurement target does not vibrate. When, for example, a method for encoding values corresponding to a displacement, a speed, an acceleration and an angular velocity of a vibration is adopted, and when all bit values in X digits which are the upper digits take 0, as illustrated in FIG. 4, it is determined that the upper digits "do not include significant information". By contrast with this, when there is a digit in which a bit value takes 1 in the X digits which are the upper digits, it is determined that the upper digits "include significant information". A determination result described herein is transmitted to the deleting unit 7 and the adder 8.

Figure 8A:
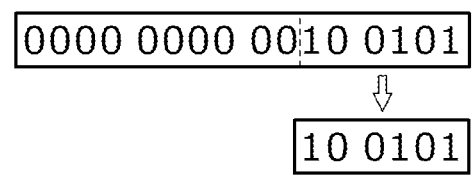
FIGS. 8A and 8B are both views for explaining a method for compressing a data sequence.

The deleting unit 7 outputs information indicating that the upper digits have been deleted from vibration data for which the determining unit 6 has determined that "the upper digits of the number of digits X do not include significant information". In this regard, as illustrated in FIG. 8A, the upper digits of the number of digits X (i.e., information corresponding to the number of digits X from MSB) are removed from vibration data for which it has been determined that the upper digits "do not include significant information", and information of the rest of lower digits (Y digits) is transmitted to the output unit 9.

Figure 8B:
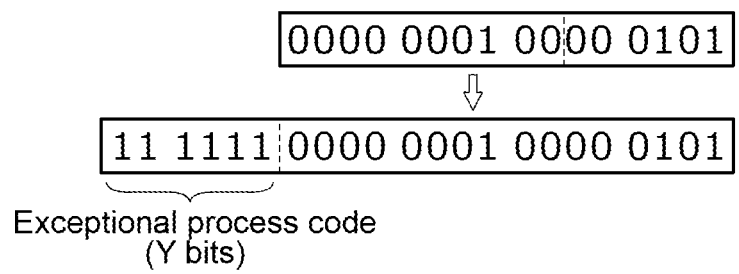

The adder 8 outputs information in which a unique code is added to the most upper digit (MSB) of vibration data for which the determining unit 6 has determined that "the upper digits of the number of digits X include significant information". In this regard, as illustrated in FIG. 8B, upper digits and the lower digits of vibration data for which it has been determined that the upper digits "include significant information" are left as is, an exceptional process code of the Y digits is added to the most upper digit (MSB) and then the information is outputted to the output unit 9.

The number of digits of the exceptional process code is set to the same number of digits as the number of lower digits Y (i.e., the number of digits obtained by subtracting the number of upper digits X from the total number of digits Z). Further, a value of the exceptional process code takes at least a value which is not included in a range which the lower digits can take (a value which does not overlap the lower digits). For example, it is assumed that, when the number of lower digits is 6 digits (6 bits) of a binary numeral, the range which the lower digits can take is from 000000 to 111110. In this case, the value of the exceptional process code is set to 111111. Further, when the range which the lower digits can take is from 000000 to 111000, the exceptional process code can be arbitrarily set to the range from 111001 to 111111.

The output unit 9 outputs the pieces of information transmitted from the deleting unit 7 and the adder 8 as "compressed vibration data (compression data)". The output compressed vibration data is transmitted to the sensor network 30 via the communication device 12. In regard to vibration data compression efficiency, if upper digits of all items of vibration data do not include significant information, a data compressibility corresponding to a rate of the number of upper digits X to the total number of digits Z is obtained. Further, as illustrated in FIG. 7C, when the number of lower digits Y is set such that the exceptional process probability is the predetermined probability V or less, a data compressibility corresponding to the rate of the number of upper digits X corresponding to the total number of digits Z and the predetermined probability V is obtained.

4. Flowchart

Figure 9:
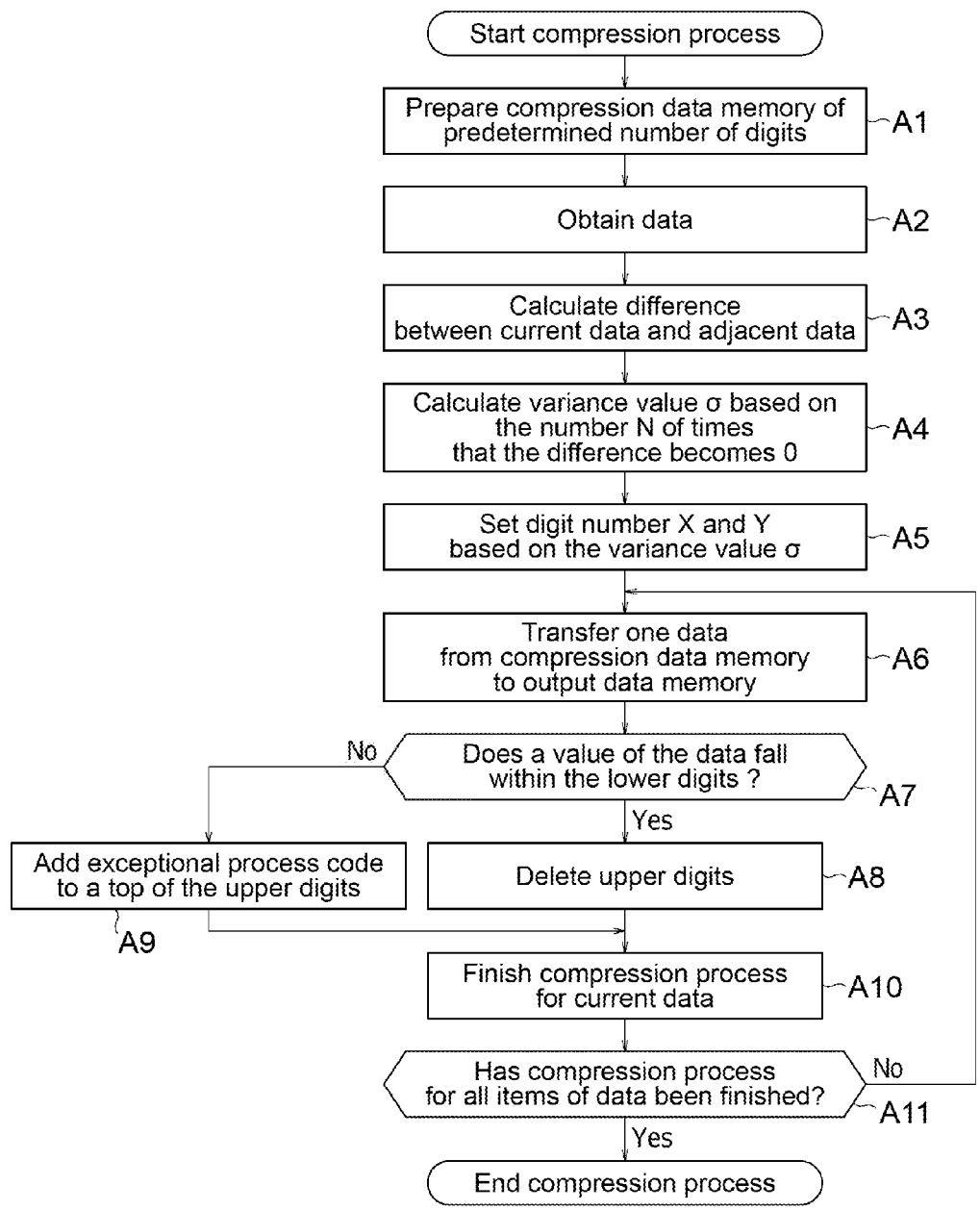
FIG. 9 is a flowchart for explaining a data compression method.

FIG. 9 is a flowchart illustrating a process of the data compression program P (a process of the data compression method) executed by each data compression device 10. Hereinafter, a case where the variance value σ is calculated based on difference data of vibration data, and a compression process is performed on this difference data will be described.

In step A1, the compression data memory is prepared on the memory 22 of the controller 20. In this regard, for example, a memory area which can store a predetermined number (e.g. several hundreds to several hundreds of thousands) of items of vibration data including codes of 16 digits is secured. In subsequent step A2, the obtaining unit 1 obtains a plurality of items of vibration data transmitted from the sensor 11 to record on the compression data memory.

In step A3, for all items of vibration data, the difference calculator 3 calculates difference data of items of vibration data adjacent in a times series, and overwrites the difference data on the compression data memory. Further, in step A4, the variance calculator 4 counts the number of times N that a value of the difference data takes 0, and estimates the variance value σ corresponding to this number of times N. In subsequent step A5, the digit number setting unit 5 sets the number of upper digits X and the number of lower digits Y based on the variance value σ. Thus, a deletion target bit width (the number of upper digits X) and at least a fixed bit width (the number of lower digits Y) stored before and after a compression process are determined.

In step A6, head difference data (e.g. difference data corresponding to the oldest time) of multiple items of difference data recorded on the compression data memory is transferred to an output data memory. Further, in step A7, whether or not difference data added to the output data memory in the previous step takes a value which falls within the lower digits of the number of digits Y is determined. That is, whether or not the upper digits of the number of digits X in this difference data include significant information is determined. In this regard, when, for example, all bit values of the upper digits take 0, it is determined that "the values fall within the lower digits (the upper digits do not include significant information)", and the flow moves to step A8. Meanwhile, in step A7, when the bit values of the upper digits include 1, it is determined that "the values do not fall within the lower digits (the upper digits include significant information)", and the flow moves to step A9.

When the flow moves to step A8, the deleting unit 7 deletes the upper digits of this difference data, and the flow moves to step A10. Further, when the flow moves to step A9, the adder 8 adds an exceptional process code to the most upper digit of this difference data, and the flow moves to step A10. In step A10 subsequent to these steps, a code of 6 digits from which the upper digits have been deleted or a code of 22 digits to which the exceptional process code has been added is recorded on the output data memory, and a value of the compressed data is determined. Further, in step A11, whether or not a compression process with respect to all items of difference data has been finished is determined and, in case where the compression process has not been finished, the flow moves to step A6. Thus, the compression process with respect to all items of data from difference data corresponding to an old time to difference data corresponding to a new time is repeated. When the compression process with respect to all items of difference data is finished, this flow is finished.

In addition, it is preferable to hold original vibration data without overwriting in the compression data memory the difference data calculated in step A3 to perform a compression process on vibration data transmitted from the sensor 11 instead of performing a compression process on difference data. In this case, in step A7, whether or not individual vibration data takes a value which falls within the lower digits of the number of digits Y is determined. Further, in step A8, a process of deleting the upper digits of the vibration data is performed and, in step A9, a process of adding an exceptional process code to the most upper digit (MSB) of the vibration data is performed. By repeating these processes, the compression process with respect to all items of the vibration data is performed.

Further, when a compression target is vibration data instead of difference data, it is also possible to skip the processes in steps A3 and A4. However, this is not a case when the variance value σ is calculated based on difference data. Further, when the number of upper digits X and the number of lower digits Y are preset fixed values, it is possible to skip at least the process in step A5. In this case, when a compression target is not difference data, it is possible to skip the processes in steps A3 to A5.

5. Operation Example

A vibration measuring device in which a vibration data compression sequence which is illustrated in FIG. 9 and from which the processes in steps A3 and A4 were removed was installed was made. This vibration measuring device included a built-in microcomputer which performs measurement, wireless communication and a compression arithmetic operation, and acceleration sensor which detects an acceleration of vibration. An operating voltage of the microcomputer is 3.3. [V]. Further, a microcomputer consumption current during a measuring operation is 4.98 [mA], and a sensor consumption current is 0.14 [mA]. An operation time for one measurement is 2.56 [s].

Meanwhile, the microcomputer consumption current during a wireless communication operation is 17.0 [mA], and a communication speed is 250 [kbps]. A processor of the microcomputer is a 16-bit core processor which operates at 32 [MHz], and the microcomputer consumption current during an arithmetic operation is 4.98 [mA]. Vibration data detected by an acceleration sensor is digital data obtained by a 10-bit ADC (Analog/Digital Converter), is usually handled as 2 bytes in normal cases, and therefore has 16 bits in a non-compression state.

Operating power of the vibration measuring device in case where 10-bit data is transmitted without performing a compression process on items of vibration data whose total number is 8192 is 211.5 [mJ] since an arithmetic operation for compression is zero. Meanwhile, when the compression process is performed, a compression arithmetic operation takes five arithmetic operation steps for one data, and therefore the operating power is 123.6 [mJ]. Hence, the amount of electricity is reduced to 58.4 [%] as a whole. It was found that, while power for the compression arithmetic operation and wireless communication was 168.3 [mJ] when compression was not performed, power was 80.4 [mJ] when compression was performed, and was reduced to 47.8 [%].

Next, a vibration measuring device on which a vibration data compression sequence illustrated in FIG. 9 was installed was made. This vibration measuring device does not skip the processes in steps A3 and A4 in FIG. 9. Power consumption in case where this vibration measuring device performed a compression process on difference data was measured. Operating power of the vibration measuring device for the compression process is 113.1 [mJ] since the compression process including a difference arithmetic operation process takes seven arithmetic operation steps for one data. Consequently, the amount of electricity is reduced to 53.4 [%] as a whole. It was confirmed that, while power for a compression arithmetic operation and wireless communication was 168.3 [mJ] when compression was not performed, the power was 69.9 [mJ] when compression was performed, and was reduced to 41.5 [%].

6. Function and Effect (1) Each data compression device 10 which executes the above data compression method and data compression program P deletes upper digits when the upper digits of input data do not include significant information. Further, when the upper digits include significant information, an exceptional process code is added to the most upper digit (MSB). In this case, a high load arithmetic operation such as integration or a point arithmetic operation is unnecessary. Even though such a data compression process of a simple method is a completely reversible compression process, this data compression process can suppress an arithmetic operation time and power consumption of the compression process and reduce power for communication.

For example, it is possible to compress an information amount to approximately 109 [%] of an entropy of vibration data, and realize almost the same compressibility as that of a compression method which uses Huffman codes. Further, according to trial calculation of the inventors, when the entropy of a vibration data sequence obtained by aligning 8192 items of 16-bit vibration data in a time series is 6.09 bits, a communication power reduction effect makes it possible to reduce the amount of electricity consumption to 41.5 [%] as a whole during an operation. This arithmetic operation cost is approximately ⅓ compared to that of the compression method which uses Huffman codes. Consequently, it is possible to realize the vibration measuring device which saves power more than the conventional technique, and greatly contribute to a longer operational life of a battery or a battery cell built in the vibration measuring device, improvement in a measurement frequency and application of an energy harvesting technology.

Further, the communication power reduction effect makes it possible to increase the measurement frequency to approximately 2.4 times. Thus, it is possible to build the sensor 11 of a higher sampling rate in the data compression device 10, and improve vibration state detection precision. Consequently, it is possible to improve precision to analyze vibration, noise and an operation state, and provide a communication terminal which supports an IoT system and an M2M system.

(2) By calculating difference data corresponding to a difference between items of vibration data adjacent in the time series, it is possible to reduce a data variation (variance). Consequently, it is possible to decrease the number of lower digits Y during a compression process, and enhance compression efficiency. Further, a histogram of difference data has characteristics that the histogram is likely to concentrate on a value of 0 compared to a histogram of vibration data, and a distribution becomes similar to a normal distribution. Consequently, by using the difference data, it is possible to improve precision to estimate a variance by using a model of a normal distribution.

(3) By setting the number of upper digits X and the number of lower digits Y based on the variance value σ of input data (vibration data or difference data), it is possible to optimize a probability that the lower digits include significant information. This means that it is possible to optimize a probability that an exceptional process code is added in a process of a compression process. That is, it is possible to set the number of lower digits Y such that significant information is hardly included in the upper digits in a protruding fashion, and improve data compression efficiency. For example, as illustrated in FIG. 7B, by selecting the number of lower digits Y which minimizes the average code length according to the variance value σ, it is possible to improve data compression efficiency.

(4) When a method for estimating the variance value σ based on the number of times N that a value of input data takes 0 is adopted, it is possible to easily calculate the variance value σ by using a correspondence relationship illustrated in FIG. 6B. Consequently, it is possible to skip a relatively high load arithmetic operation process of, for example, calculating the variance value σ by using equation 1, and suppress an arithmetic operation time and power consumption of the compression process.

(5) The number of digits of the exceptional process code is set to the same number of digits as the number of lower digits Y (i.e., the number of digits obtained by subtracting the number of upper digits X from the total number of digits Z). Consequently, without excessively increasing the amount of compressed data, it is possible to easily distinguish between data from which upper digits have been deleted, and data to which a unique code has been added. Consequently, it is possible to improve data compression efficiency while securing reversibility of the compression process.

7. Modified Example

In the above-described embodiment, a data compression device 10 including a built-in sensor 11 and communication device 12 has been exemplified. However, the sensor 11 and the communication device 12 may also be separately provided. That is, a device configuration to connect the separate sensor 11 to an outside of the data compression device 10 may be employed, or a device configuration to connect the separate communication device 12 to an outside of the data compression device 10 may be employed. At least a controller 20 needs to be able to obtain vibration data and output compressed data. In addition, an output method is not limited to a wireless method and may be a wired method. Further, an output destination is not limited to the outside of the data compression device 10, and may be an auxiliary storage device 23 or a recording medium 14.

Furthermore, in the above-described embodiment, a data compression program P is stored in a memory 22, the auxiliary storage device 23 and the recording medium 14 of the data compression device 10. However, an area in which the data compression program P is recorded and stored can be arbitrarily set. For example, the data compression program P may be installed in an external storage device or a computer installed on a sensor network 30 connected with the data compression device 10. Further, the data compression program P can be divided into a plurality of components, and recorded and stored in different areas.

Furthermore, in the above-embodiment, the method for setting the numbers of digits X and Y based on a variance value σ as illustrated in FIGS. 7B and 7C has been described. However, it is also possible to skip calculation of the variance value σ and set the numbers of digits X and Y based on the degree of variance of input data. For example, as illustrated in FIG. 10, a relationship between the number of times N that a value of input data takes 0, and the number of lower digits Y may be stored in advance as a map, a graph or a table.

Figure 10:
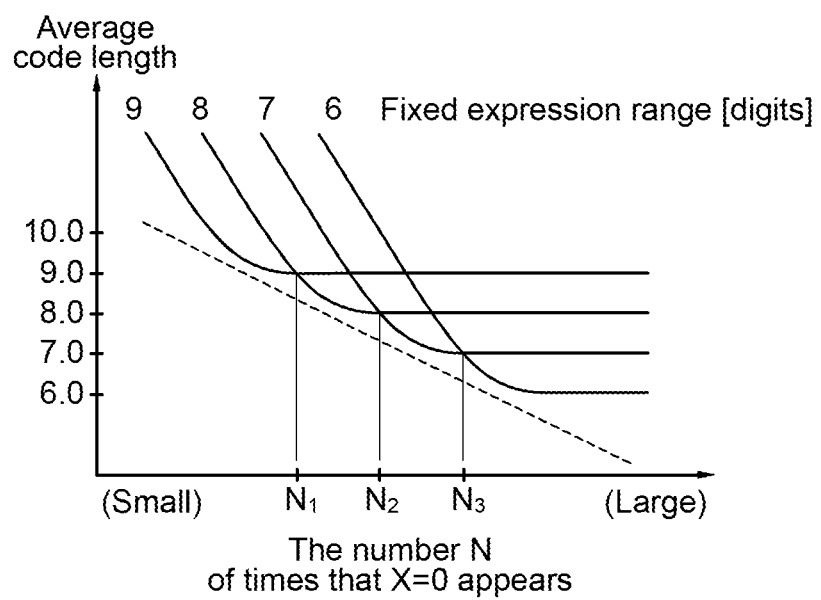
FIG. 10 is a graph illustrating a relationship between an average code length and the number of times of appearances of $x=0$.

FIG. 10 is a graph illustrating a relationship between the number of times that 10-bit input data is observed, and an average code length. In FIG. 10, an average code length in case where lower digits corresponding to a fixed expression range are set to 6 digits to 9 digits, respectively, is superimposed and illustrated. Further, a broken line in FIG. 10 indicates an entropy (an expectation value of a minimum information amount). It is preferable to select an average code length of a graph positioned near the broken line to minimize the information amount. That is, it is found that it is preferable to set the number of lower digits to 9 digits when the number of times of appearances of x=0 (the number of times that a value of input data takes 0) is less than $N_1$, to 8 digits when the number of times is in a range from $N_1$ to $N_2$, to 7 digits when the number of times is in the range from $N_2$ to $N_3$ and to 6 digits when the number of times is $N_3$ or more. Thus, even when calculation of the variance value σ is skipped, it is possible to provide the same effect as that of the above-described embodiment by setting the numbers of digits X and Y based on the degree of variance of input data.

As described above, according to the disclosed technique, it is possible to reduce power consumption of a reversible compression process.

8. Supplementary Note

The following supplementary notes will be disclosed for the embodiment including the above modified example.

(Supplement)

The phrase that "when the upper digits do not include significant information" means that "a value does not change compared to a value obtained by encoding a state where a measurement target does not vibrate" such as that "all values of upper digits take 0". Further, the "unique code" refers to a "code which has a value which is not included in a range which a lower digit (fixed digit) can take".

The "unique code" means a code which has a value which does not overlap any value of lower digits. That is, the "unique code" means a code which has a value which is not included in a range which the lower digits can take. For example, it is assumed that, when the number of lower digits is 6 digits of a binary numeral, the range which the lower digits can take is from 000000 to 111110. In this case, the unique code is set to 111111. Further, the range which the lower digits can take is from 000000 to 111000, and the unique code can be arbitrarily set to the range from 111001 to 111111.

Furthermore, the "unique code" has the same number of digits as that of the lower digits.

In addition, it is preferable to select as the variance value the digit number (X) which minimizes the average code length.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A data compression device including a processor to perform a procedure, the procedure comprising:
   obtaining data of a predetermined number (Z) of digits in a time series, the data being obtained by encoding a vibration state of a measurement target; and
   performing a compression process on a difference between items of the data adjacent in the time series, the compression process including
   deleting upper digits when the upper digits do not include significant information, a digit number (X) of the upper digits being smaller than the predetermined number (Z), and adding a unique code to a top of the upper digits when the upper digits include significant information.

2. The data compression device according to claim 1, wherein the processor sets the digit number (X) based on a variance value of the data in the time series.

3. The data compression device according to claim 1, wherein the processor sets the digit number (X) based on a variance value of the data in the time series.

4. The data compression device according to claim 2, wherein the processor estimates the variance value based on a number of times that the difference between the items of the data adjacent in the time series is less than a predetermined value.

5. The data compression device according to claim 3, wherein the processor estimates the variance value based on a number of times that the difference between the items of the data adjacent in the time series is less than a predetermined value.

6. The data compression device according to claim 1, wherein the unique code includes a number of digits (Y) obtained by subtracting the digit number (X) from the predetermined number (Z).

7. The data compression device according to claim 2, wherein the unique code includes a number of digits (Y) obtained by subtracting the digit number (X) from the predetermined number (Z).

8. The data compression device according to claim 3, wherein the unique code includes a number of digits (Y) obtained by subtracting the digit number (X) from the predetermined number (Z).

9. The data compression device according to claim 4, wherein the unique code includes a number of digits (Y) obtained by subtracting the digit number (X) from the predetermined number (Z).

10. The data compression device according to claim 5, wherein the unique code includes a number of digits (Y) obtained by subtracting the digit number (X) from the predetermined number (Z).

11. A data compression method by a processor for obtaining data of a predetermined number (Z) of digits in a time series, and performing a compression process on the data, the data being obtained by encoding a vibration state of a measurement target, the data compression method comprising:

deleting upper digits when the upper digits does not include significant information, a digit number (X) of the upper digits being smaller than the predetermined number (Z) of digits; and adding a unique code to a top of the upper digits when the upper digits include significant information, the unique code including a number of digits (Y) obtained by subtracting the digit number (X) from the predetermined number (Z).

12. A computer-readable recording medium including recorded thereon a data compression program that is executed by a computer that obtains data of a predetermined number of digits in a time series, and performs a process of compressing the data, the data being obtained by encoding a vibration state of a measurement target, the data compression program causing the computer to execute a process of:

deleting upper digits when the upper digits does not include significant information, a digit number (X) of the upper digits being smaller than the predetermined number (Z) of digits; and adding a unique code to a top of the upper digits when the upper digits include significant information, the unique code including a number of digits (Y) obtained by subtracting the digit number (X) from the predetermined number (Z).

13. A data compression device including a processor to perform a procedure, the procedure comprising:

obtaining data of a predetermined number (Z) of digits in a time series, the data being obtained by encoding a vibration state of a measurement target; and performing a compression process on the data, wherein the compression process includes:

deleting upper digits when the upper digits do not include significant information, a digit number (X) of the upper digits being smaller than the predetermined number (Z); and adding a unique code to a top of the upper digits when the upper digits include significant information, the unique code including a number of digits (Y) obtained by subtracting the digit number (X) from the predetermined number (Z).

\* \* \* \* \*